(12) United States Patent
Lee

(10) Patent No.: US 11,747,289 B2
(45) Date of Patent: Sep. 5, 2023

(54) SYSTEM OF MEASURING IMAGE OF PATTERN IN HIGH NA SCANNING-TYPE EUV MASK

(71) Applicant: SAMSUNG ELECTRONICS CO., LTD., Suwon-si (KR)

(72) Inventor: Donggun Lee, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 157 days.

(21) Appl. No.: 17/509,862

(22) Filed: Oct. 25, 2021

(65) Prior Publication Data

US 2023/0126613 A1    Apr. 27, 2023

(51) Int. Cl.
*G01N 23/22* (2018.01)
*G03F 1/84* (2012.01)

(52) U.S. Cl.
CPC .............. *G01N 23/22* (2013.01); *G03F 1/84* (2013.01)

(58) Field of Classification Search
CPC .. G01N 23/22; G03F 1/84; G03F 1/22; G03F 1/24
See application file for complete search history.

(56) References Cited

U.S. PATENT DOCUMENTS

| 10,042,270 B2* | 8/2018 | Ekinci | G03F 7/7065 |
| 2007/0064997 A1 | 3/2007 | Itoh | |
| 2011/0033025 A1 | 2/2011 | Lee et al. | |
| 2011/0240863 A1 | 10/2011 | Lee et al. | |
| 2012/0268159 A1 | 10/2012 | Cho et al. | |
| 2013/0056642 A1 | 3/2013 | Lee et al. | |

FOREIGN PATENT DOCUMENTS

| KR | 100875569 B1 | 12/2008 |
| KR | 1020090120121 A | 11/2009 |
| KR | 1020110110578 A | 10/2011 |
| KR | 1020130044387 A | 5/2013 |
| KR | 101535230 B1 | 7/2015 |
| KR | 101811306 B1 | 12/2017 |
| KR | 1020200121546 A | 10/2020 |

* cited by examiner

*Primary Examiner* — Jurie Yun

(74) *Attorney, Agent, or Firm* — Sughrue Mion, PLLC

(57) ABSTRACT

A system of measuring an image of a pattern in a high NA scanning-type extreme ultra-violet (EUV) mask is disclosed. The system may include a light source generating an EUV light; an toroidal mirror; an flat mirror allowing light, which is reflected by the toroidal mirror, to be incident into the mask; an beam splitter; a light detection part; an anamorphic zone-plate lens focusing a transmitted portion of a light emitted from the beam splitter on the mask; a stage; and an anamorphic photo sensor, which is configured to measure an energy of a reflected portion of the coherent EUV light, is composed of a detector array, and has different sizes from each other in horizontal and vertical directions of an incidence surface of the detector array.

5 Claims, 5 Drawing Sheets

(5 of 5 Drawing Sheet(s) Filed in Color)

SYSTEM OF MEASURING IMAGE OF PATTERN IN HIGH NA SCANNING-TYPE EUV MASK

BACKGROUND OF THE INVENTION

The present disclosure relates to a system of measuring an image of a pattern in a high NA scanning-type extreme ultraviolet (EUV) mask, and in particular, a system of measuring an aerial image of a EUV photomask pattern, which is used in a high NA EUV exposure process that is performed to form a fine pattern on a wafer in a semiconductor fabrication process.

Recently, an EUV scanner using an EUV light having a wavelength of 13.5 nm is being applied to a semiconductor fabrication process. For a first-generation EUV lithography system using the EUV scanner, the scanner determining a line width of a pattern is provided to have a numerical aperture (NA) value of 0.33. The EUV lithography system having the NA value of 0.33 has an economical efficiency, when it is used to fabricate a semiconductor device, in which patterns are provided to have a half pitch (HP) of 16 nm.

However, with the introduction of the artificial intelligence (AI) and 5-th generation (5G) technologies, there is an increasing demand for a scaled-down semiconductor device having HP of 16 nm or less. Thus, it is expected that an EUV scanner having an increased NA value (e.g., 0.55) will be used for the semiconductor fabrication process.

The EUV scanner having the increased NA value of 0.55 is called a high NA EUV scanner to distinguish it from the conventional scanner, and a lithograph process using the same is called a high NA EUV lithograph process. The high NA EUV lithography process has some peculiar features; for example, an anamorphic optical system is used in the scanner. Thus, when mask patterns of the photomask are copied on a wafer, a ¼ reduction pattern is formed on the wafer, like that in the conventional scanner, in a left/right direction of the mask (e.g., in a direction orthogonal to a scanning direction), whereas a ⅛ reduction pattern is formed on the wafer in an up/down direction of the mask (e.g., in the scanning direction). In this case, to form the pattern of the same size on the wafer in the up, down, left, and right directions, the size of the mask pattern in the up/down direction should be two times that in the left and right directions. This effect in the anamorphic optical system may affect not only the structure of the optical system of the described scanner but also a shape of a pattern formed on the mask.

The following is the reason that a high NA scanner has the structure of the anamorphic optical system. Due to a mask incidence angle of about 6°, a NA value, which can be achieved by the mask, is restricted to the value of sin(6°) (i.e., about 0.1), and in a ¼ reduction optical system, the largest value of NA may be 0.1*4=0.4. Thus, in order to obtain a NA value of 0.55 or larger, it is necessary to introduce a ⅛ reduction optical system. This is because, in the ⅛ reduction optical system, it is possible to obtain a NA value of 0.1*8=0.8. However, if the reduction ratio decreases from ¼ to ⅛, a pattern exposing process on the wafer may suffer from low productivity. In order to avoid the problem of low productivity, it is necessary to maintain the conventional ¼ reduction ratio for a normal surface, not for the incidence surface of 6°. Thus, it is necessary to introduce the anamorphic optical system, in which the ⅛ reduction is applied to a scan direction (i.e., parallel to the plane of incidence angle of 6 degree) and the conventional ¼ reduction is maintained in a direction perpendicular thereto, for the high NA scanner.

In the case where the scanner with the anamorphic optical system is used in a high NA lithography process, a high NA EUV mask is required to have a mask pattern that is formed to be suitable for the anamorphic optical system, and in this case, due to the asymmetry between the reduction ratio in the up/down and left/right directions, the high NA EUV mask should be manufactured to have the asymmetry in the pattern size.

A process of manufacturing the high NA EUV mask may include processes of inspecting and correcting defects in photomask patterns and yield in a wafer-level process is greatly affected by the inspection and correction processes. This is because a defect on photomask patterns are copied to all wafers. A defect pattern, which is found by the mask inspection process, may be corrected by the correction process. An exposure process using a scanner may be directly performed on a wafer, and then, a SEM inspection process may be performed to examine whether the correction is successful. However, this method requires a large amount of cost and a long evaluation time, and thus, in the current mask manufacturing process, a system, which has a microscope structure and is configured to measure an aerial image of a mask and to emulate an optical system in the scanner, is used to cost-effectively evaluate influence of a pattern on a wafer.

PRIOR ART DOCUMENT

Patent Document (Patent Document 0001) KR 10-1811306
(Patent Document 0002) KR 10-0875569

SUMMARY

An embodiment of the inventive concept provides a high performance anamorphic aerial image measuring system for a high NA EUV mask.

An embodiment of the inventive concept provides a technology of efficiently focusing a coherent EUV light on an anamorphic zone-plate lens and a technology of imaging an anamorphic mask pattern using the anamorphic zone-plate lens and an anamorphic photo sensor.

An embodiment of the inventive concept provides a high performance anamorphic aerial image measuring system of effectively removing a noise from a coherent EUV light using an x-ray beam splitter.

According to an embodiment of the inventive concept, a system of measuring an image of a pattern in a high NA scanning-type extreme ultra-violet (EUV) mask may be provided. The system may include a coherent EUV light source generating an EUV light through a higher order generation; an x-ray toroidal mirror focusing the generated EUV light on an incidence surface to have different focal lengths in horizontal and vertical directions of the incidence surface; an x-ray flat mirror allowing light, which is reflected by the x-ray toroidal mirror, to be incident into the mask; an x-ray beam splitter configured to reflect a portion of a beam focused by the x-ray toroidal mirror and to transmit the other portion of the beam; a light detection part detecting the reflected portion of the beam emitted from the x-ray beam splitter; an anamorphic zone-plate lens focusing the transmitted portion of the beam emitted from the x-ray beam splitter on the mask, the anamorphic zone-plate lens having the same focal length and different numerical apertures (NA) in a vertical direction of an incidence surface; a stage, on which a reflection-type EUV mask is placed, and which moves in a direction of a x- or y-axis to scan an image of the reflection-type EUV mask; and an anamorphic photo sensor, which is configured to measure an energy of the reflected portion of the coherent EUV light when the coherent EUV light is reflected by the EUV mask, is composed of a detector array, and has different sizes from each other in horizontal and vertical directions to an incidence surface of the detector array.

In addition, the x-ray flat mirror may be configured such that light, which is reflected from the x-ray toroidal mirror and has an angle smaller than 4°, is incident into the EUV mask at an angle of 4 to 8°.

In addition, the x-ray toroidal mirror may be configured to focus an EUV beam on the anamorphic zone-plate lens in a shape of the zone-plate lens and thereby to improve light focusing efficiency of the zone-plate lens.

In addition, when light, which is focused by the anamorphic zone-plate lens and is reflected by a surface of the mask, is diffused in an anamorphic shape, to detect the light diffused in the anamorphic shape, the anamorphic photo sensor may be configured to have different device sizes in horizontal and vertical directions to an incidence surface. Here, the anamorphic photo sensor may be provided to satisfy the following equations $D(x)=NA(x)*L$, and $D(y)=NA(y)*L$, where $D(x)$ and $D(y)$) are sizes of the array in the directions, L is a distance to the mask, and $NA(x)$ and $NA(y)$ are numerical apertures of the anamorphic zone-plate lens in the directions.

In addition, due to a difference between the NA values $NA(x)$ and $NA(y)$, a measurement image, which is measured by the anamorphic photo sensor, may be measured with different resolutions in the x- and y-axis directions. As for the measurement image, the NA values $NA(y)$ and $NA(x)$ may be reconstructed in connection with ⅛ and ¼ reduced images, respectively. Here, the numerical aperture $NA(x)$ may be a value in the left/right direction of the mask (i.e., parallel to the x-axis), and the numerical aperture $NA(y)$ may be a value in the up/down direction of the mask (i.e., parallel to the y-axis).

In addition, light reflected by the x-ray beam splitter may be detected by the light detection part and is used as a reference light, a signal value of the reference light detected by the light detection part may be used to remove a noise component, which is caused by a variation in intensity of light generated by the EUV light source, from a signal measured by the anamorphic photo sensor, and for both of x and y coordinates of the stage changed by driving the stage, the signal value of the reference light may be compared with the signal value of the measured light to remove a noise component.

In addition, the stage may include a fine stage, which is used to perform a scanning operation for obtaining an image in directions of x- and y-axes, and a coarse stage, which is configured to move a wafer to a measurement position.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

Hereinafter, a system of measuring an image of a pattern in a scanning-type EUV mask, according to an embodiment of the inventive concept, will be described in more detail with reference to the accompanying drawings.

According to an embodiment of the inventive concept, a system of measuring an image of a pattern in a high NA scanning-type extreme ultra-violet (EUV) mask may include a coherent EUV light source generating an EUV light through a high order generation; an x-ray toroidal mirror focusing the generated EUV light on an incidence surface to have different focal lengths in horizontal and vertical directions of the incidence surface; an x-ray flat mirror allowing light, which is reflected by the x-ray toroidal mirror, to be incident into the mask; an x-ray beam splitter configured to reflect a portion of a beam focused by the x-ray toroidal mirror and to transmit the other portion of the beam; a light detection part detecting the reflected portion of the beam emitted from the x-ray beam splitter; an anamorphic zone-plate lens focusing the transmitted portion of the beam emitted from the x-ray beam splitter on the mask, the anamorphic zone-plate lens having the same focal length and different numerical apertures (NA) in horizontal and vertical directions of an incidence surface; a stage, on which a reflection-type EUV mask is placed, and which moves in a direction of a y- or y-axis to scan an image of the reflection-type EUV mask; and an anamorphic photo sensor, which is configured to measure an energy of the reflected portion of the coherent EUV light when the coherent EUV light is reflected by the EUV mask, is composed of a detector array, and has different sizes from each other in horizontal and vertical directions to an incidence surface of the detector array.

According to an embodiment of the inventive concept, a system of measuring an image of a pattern in a high NA scanning-type EUV mask may be configured to analyze a pattern defect in an exposure mask, with high resolution, based on an anamorphic aerial image, and may provide promising optical technology for the semiconductor industry.

Figure 1:
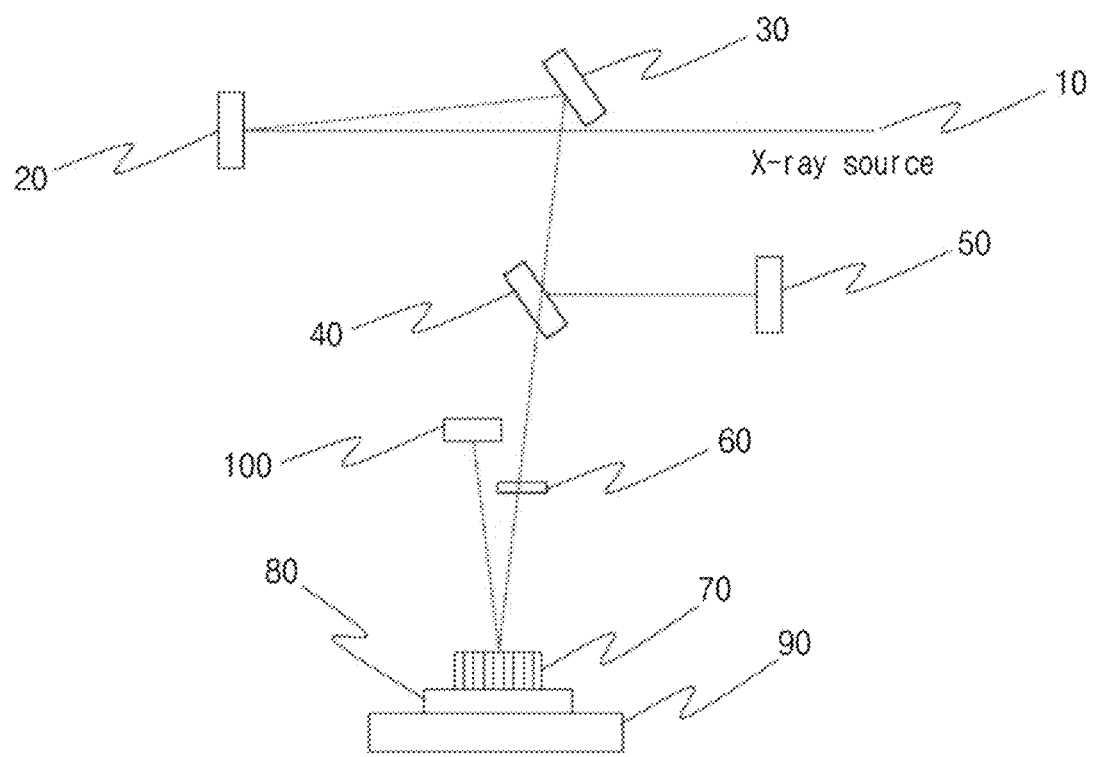
FIG. 1 is a diagram schematically illustrating a system of measuring an image of a pattern in a scanning-type EUV mask according to an embodiment of the inventive concept.

FIG. 1 is a diagram schematically illustrating a system of measuring an image of a pattern in a scanning-type EUV mask according to an embodiment of the inventive concept.

A system of measuring an image of a pattern according to an embodiment of the inventive concept may include an x-ray toroidal mirror 20 and an x-ray flat mirror 30, which are used to deliver an EUV light output from a light source 10 and constitute a beam focusing part. The x-ray toroidal mirror 20 may be configured to form a measurement light in an anamorphic shape, and the measurement light may be incident into an anamorphic zone-plate lens 60. Here, a transmission light may enable an anamorphic photo sensor 100, which is used to detect light reflected by an EUV mask 70, to obtain a high-resolution anamorphic aerial image.

In an embodiment, to enable light, which is reflected from the x-ray toroidal mirror 20 at an angle smaller than 4°, to be incident into the EUV mask 70 at an angle of 5 to 7° (e.g., 6°), an optical system may be configured to irradiate the EUV mask 70 with an x-ray in a maximally perpendicular direction.

A beam focusing part (e.g., an x-ray toroidal mirror, an x-ray flat mirror, and/or a beam splitter) may include the x-ray flat mirror 30 and the x-ray toroidal mirror 20, which are used to adjust an angle of a beam incident into the anamorphic zone-plate lens 60 to a specific value and to form a focal point in an anamorphic shape. If a beam emitted from an x-ray source is first reflected by the x-ray flat mirror 30, an incidence angle and a position of the x-ray flat mirror 30 and a position of the x-ray toroidal mirror 20 may be determined such that the beam is incident into the x-ray toroidal mirror 20 at an incidence angle less than 2° and the beam reflected by the x-ray toroidal minor 20 is incident into the anamorphic zone-plate lens 60 at a constant angle.

Furthermore, in the beam focusing part, if a beam emitted from the x-ray source is first reflected by the x-ray toroidal minor 20, an incidence angle and a position of the x-ray flat minor 30 and a position of the x-ray toroidal minor 20 may be determined to satisfy the afore-described condition.

In an embodiment, a coherent EUV light may include a noise component, and thus, in order to remove the noise component, an x-ray beam splitter 40 may be used to send a portion of a beam, which is focused on the anamorphic zone-plate lens 60, to a light detection part or photo sensor 50, which is used to measure a reference light. Since light, which is measured by the light detection part for detecting the reference light, has the same noise as light in the anamorphic zone-plate lens 60, the noise component in the coherent EUV light may be removed by dividing a signal, which is reflected by the EUV mask 70 and is measured by the anamorphic photo sensor 100, by a signal, which is measured by reference photodetector.

Here, all signals at x and y coordinates changed by motion of a stage may be compared with the reference light to remove the noise component at every point, and detection in an arbitrarily chosen region may be performed under a different magnifying condition, based on data obtained by comparing the measurement light with the reference light. In this case, it may be possible to accurately perform the measurement process.

The beam splitter 40 may be formed to have a stacking structure of molybdenum (Mo) and silicon (Si), and an amount of light, which is reflected by the beam splitter 40 and is incident into the light detection part 50, may be about 5-10% of a total amount of light transmitted from the focusing part. An amount of light, which passes through the beam splitter 40 and is incident into the anamorphic zone-plate lens 60, may be about 60-80% of a total amount of light transmitted from the focusing part.

Thus, the reference light, which is detected by the light detection part 50, may be used to obtain a detection value for removing a noise component from light reflected by the EUV mask 70.

A beam, which is incident into the EUV mask 70 through the anamorphic zone-plate lens 60, may be used as a reflection light, which is reflected toward the anamorphic photo sensor 100 and is used to detect a mask pattern. The anamorphic zone-plate lens 60 and the anamorphic photo sensor 100 will be described in more detail with reference to FIGS. 2 to 5.

In addition, a stage, which is used to realize a scanning measurement or a mask scanning, may include a coarse stage 90 and a fine stage 80. The coarse stage may be designed to move a desired portion of the mask to a specific position. The fine stage may be placed on the coarse stage, the EUV mask 70 may be designed such that a scanning operation can be performed in x and y directions (e.g., in the horizontal and vertical directions of the incidence surface) through motion of the fine stage to measure an anamorphic aerial image. When an image measurement region of the mask is scanned using the stage, the scanning may be performed such that a ratio between sizes in the horizontal and vertical directions of the incidence surface has the same value as that in a point focused on a surface of the EUV mask 70 by the anamorphic zone-plate lens 60. For example, for NA 0.55, the size of the beam may be 98 nm and 49 nm, respectively, in the horizontal and vertical directions of the incidence surface, and an image of the mask may be measured by scanning the mask in the horizontal and vertical directions of the incidence surface, at this ratio.

Figure 2:
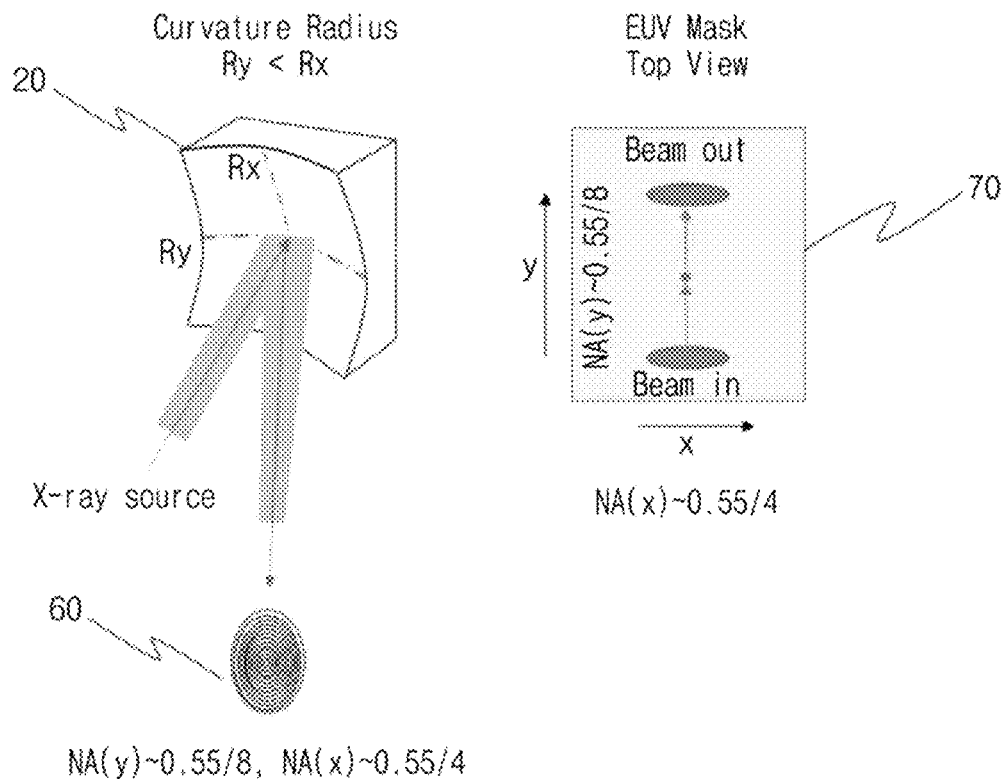
FIG. 2 is a diagram illustrating a toroidal mirror, which is provided as a part of the system of measuring an image of a pattern in a scanning-type EUV mask according to an embodiment of the inventive concept.

FIG. 2 is a diagram illustrating an x-ray toroidal mirror, which is provided as a part of the system of measuring an image of a pattern in a scanning-type EUV mask according to an embodiment of the inventive concept. The x-ray toroidal mirror 20 may be configured such that a size of a focused beam on the anamorphic zone-plate lens 60 in a vertical direction of the incidence surface is about two times that in a horizontal direction of the incidence surface. For example, the x-ray toroidal mirror 20 may be configured to have a direction-dependent spherical surface. In an embodiment, the x-ray toroidal mirror 20 may be manufactured such that a curvature (i.e., a radius) in the horizontal direction of the incidence surface is ½ of that in the vertical direction.

As shown in the drawings, a reflection light corresponding to an anamorphic shape of the anamorphic zone-plate lens 60 may be provided by the x-ray toroidal mirror 20, in which a spherical surface has a different size in each direction, and thus, by obtaining the reflection light corresponding to an array structure of the anamorphic photo sensor 100, it may be possible to obtain a high-resolution image of a mask pattern.

The anamorphic zone-plate lens 60 may have an anamorphic structure, in which a diameter in the horizontal direction of the incidence surface is smaller than that in the vertical direction of the incidence surface. If a focal length of the anamorphic zone-plate lens 60 is f and the high NA EUV scanner has a NA value of 0.55, the anamorphic zone-plate lens 60 may be defined to have a radius $r=f*0.55/8$ in the horizontal direction of the incidence surface and to have a radius $r=f*0.55/4$ in the vertical direction, and the radius in the vertical direction may be two times the radius in the horizontal direction.

Thus, a point, which is focused on a surface of the EUV mask 70 by the anamorphic zone-plate lens 60, has an elliptical shape, which has lengths of $13.5/(2*0.55/8)$ nm and 13.5/(2*0.55/4) nm in the horizontal and vertical directions of the incidence surface.

Figure 3:
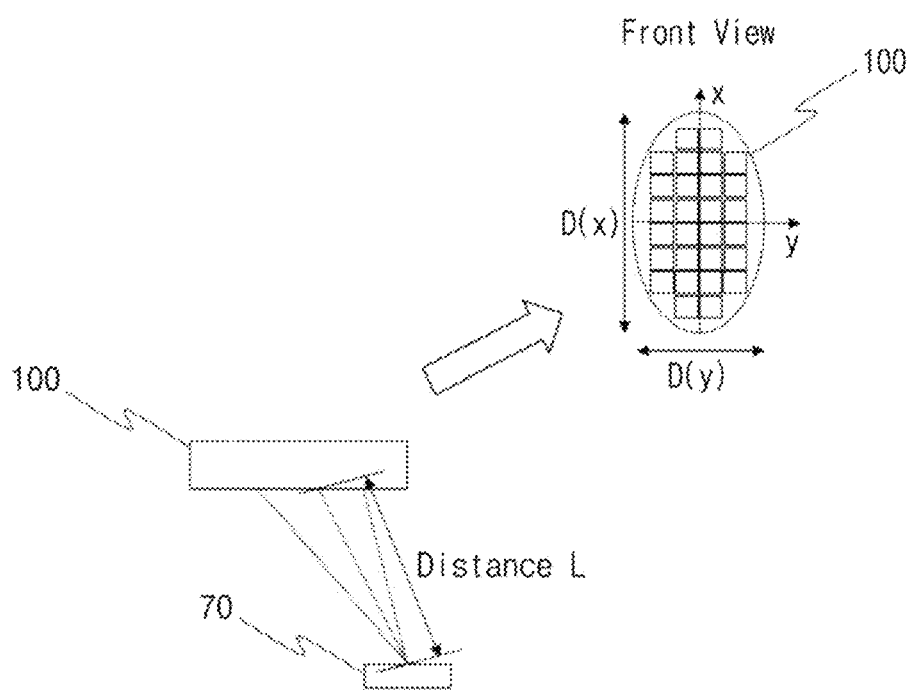
FIG. 3 is a diagram illustrating a structure of an anamorphic photo sensor, which is provided as a part of the system of measuring an image of a pattern in a scanning-type EUV mask according to an embodiment of the inventive concept.
Figure 4:
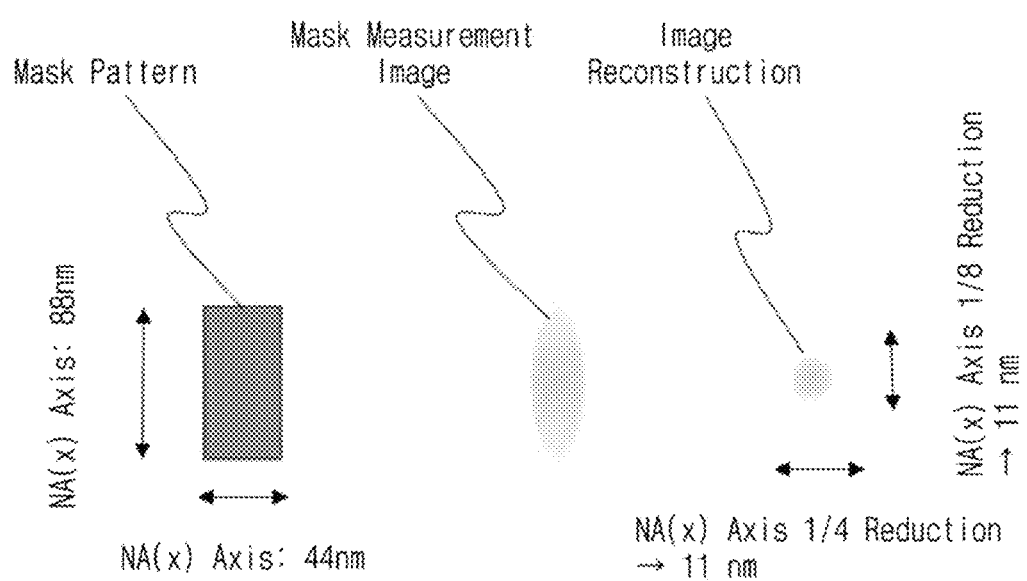
FIG. 4 is a diagram illustrating a method of measuring an image using the anamorphic photo sensor in the system of measuring an image of a pattern in a scanning-type EUV mask according to an embodiment of the inventive concept.

FIG. 3 is a diagram illustrating a structure of an anamorphic photo sensor, which is provided as a part of the system of measuring an image of a pattern in a scanning-type EUV mask according to an embodiment of the inventive concept, and FIG. 4 is a diagram illustrating a method of measuring an image using the anamorphic photo sensor in the system of measuring an image of a pattern in a scanning-type EUV mask according to an embodiment of the inventive concept.

The anamorphic photo sensor 100 for detecting an x-ray light may be composed of a detector array. In order to obtain an optimized emulation result on a structure of an illuminating system of an anamorphic scanner, the sensor array 100 may have different sizes in the horizontal and vertical directions of the incidence surface, like the anamorphic zone-plate lens 60, and its ratio and directions may be the same as a diameter ratio and directions in the anamorphic zone-plate lens 60. It may be designed to have a radial structure or a mesh shape.

A left/right direction (e.g., an x direction) of the EUV mask 70 may be aligned to a vertical direction of the incidence surface, and an up/down direction (e.g., a y direction) of the mask may be aligned to the horizontal direction of the incidence surface. When a focusing operation is performed using the anamorphic zone-plate lens 60 and the scan stage is driven by a distance that is given in the same ratio as a ratio between sizes of the focus beam in x and y directions, an aerial image, which is reconstructed through a light measurement operation by a device that is one of devices constituting the anamorphic detector array and is located at a position (x, y), may be designed to correspond to an aerial image by an inclined light of a high NA EUV scanner (e.g., σ=(x*4/L, y*8/L)) in a one-to-one correspondence.

Aerial images of the scanner under another inclined condition may be reconstructed through combination of aerial images, which have been measured by each detector array of the detection par, without an additional measurement process. During the image reconstruction, an image size may be reduced by ¼ times in the x direction and by ⅛ times reduction in the y direction such that the high NA EUV scanner corresponds to an aerial image projected on a wafer in a one-to-one correspondence.

Figure 5:
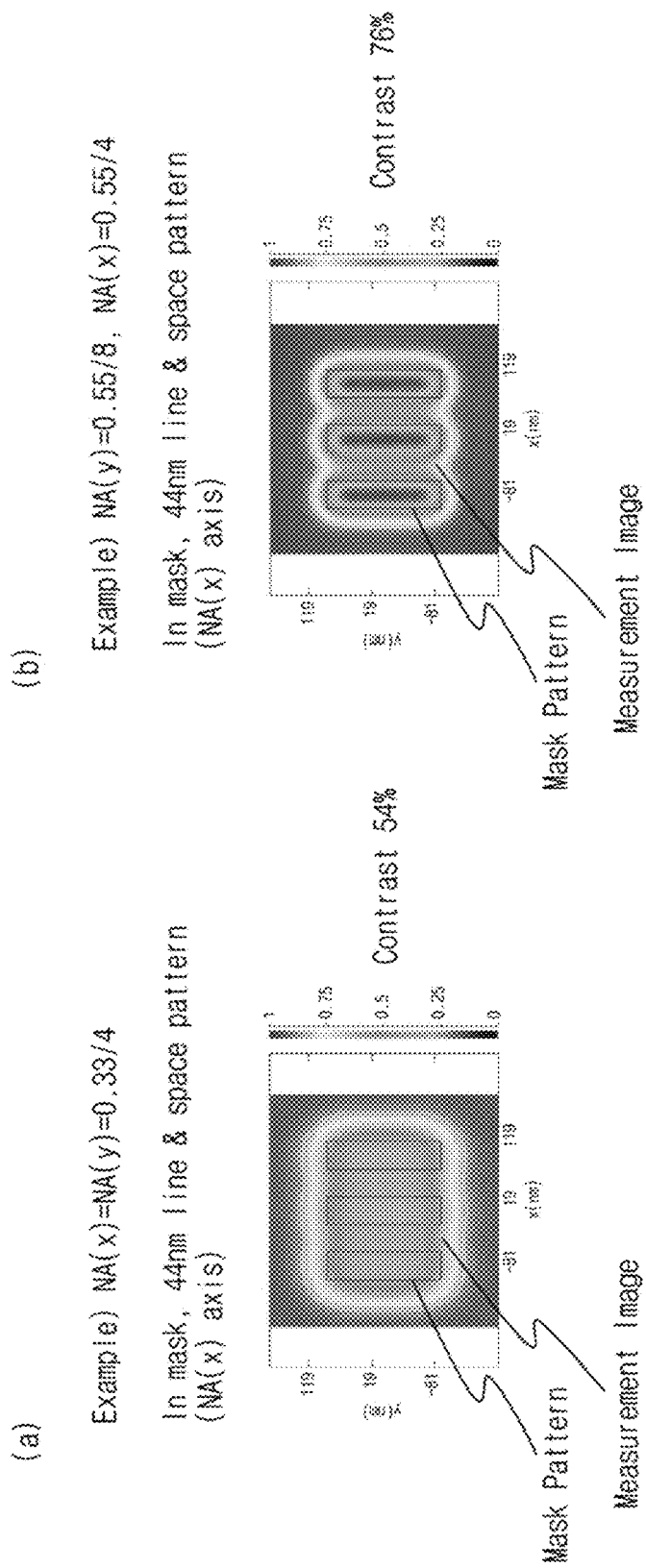
FIG. 5 is a diagram illustrating aerial images, which are obtained using a detection part of the system of measuring an image of a pattern in a scanning-type EUV mask according to an embodiment of the inventive concept.

FIG. 5 is a diagram illustrating aerial images, which are obtained using a detection part of the system of measuring an image of a pattern in a scanning-type EUV mask according to an embodiment of the inventive concept. FIG. 5(a) shows an image measured from a 44 nm mask pattern at NA 0.33, FIG. 5(b) shows an image measured when radii in the horizontal and vertical directions are given by r=f*0.55/8 and r=f*0.55/4, respectively. The contrast values in FIGS. 5(a) and 5(b) were 54% and 76%, respectively, which were different from each other. This shows that, by using an anamorphic structure, it is possible to obtain a detection signal of a mask pattern with improved accuracy.

Figure 6:
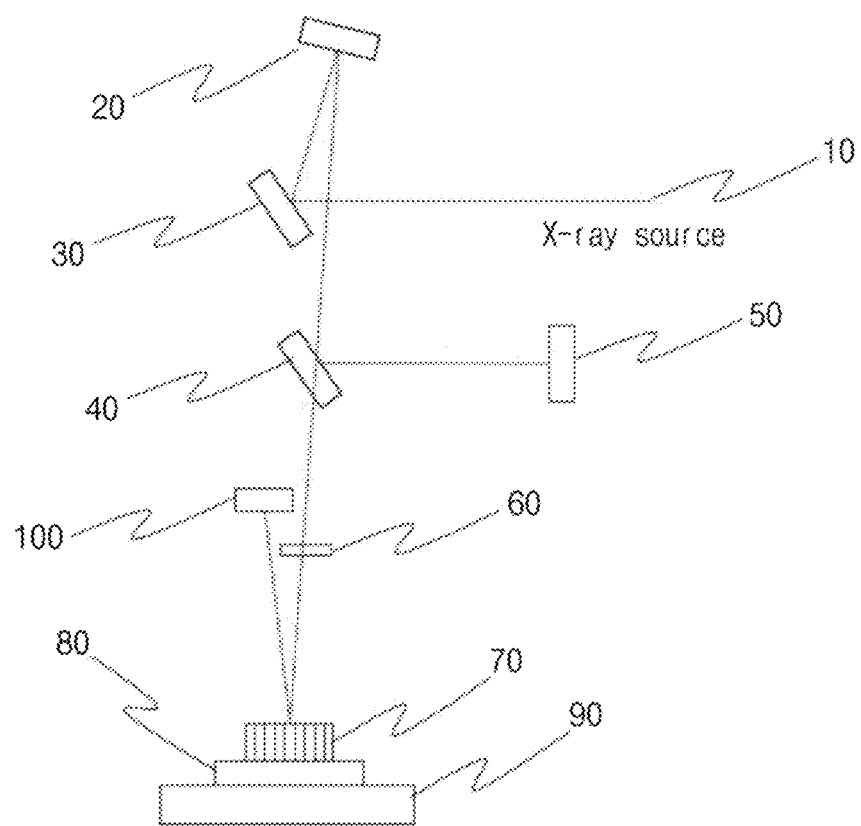
FIG. 6 is a diagram schematically illustrating a system of measuring an image of a pattern in a scanning-type EUV mask according to another embodiment of the inventive concept, and in particular, illustrating an example in which a position of an optical system is changed.

FIG. 6 is a diagram schematically illustrating a system of measuring an image of a pattern in a scanning-type EUV mask according to another embodiment of the inventive concept, and in particular, illustrating an example in which a position of an optical system is changed. If, as shown in FIG. 6, the x-ray toroidal mirror 20 and the x-ray flat mirror 30 are disposed in an order different from that in the previous embodiment, an incident angle and a position of the x-ray flat mirror 30 and a position of the x-ray toroidal mirror 20 may be determined such that an incidence angle of the anamorphic zone-plate lens 60 and an incidence angle of the toroidal mirror have the same ranges or values as those in the previous embodiment, and in this case, the system may be designed to have the same measurement performance.

According to an embodiment of the inventive concept, by using optical properties of the anamorphic zone-plate lens 60 and the anamorphic photo sensor 100, it may be possible to measure a pattern in the EUV mask 70 with high accuracy and to quickly examine whether there is a defect. In other words, since an EUV beam is focused on a surface of a mask through the anamorphic zone-plate lens 60, it may be possible to reduce a size of a focal point in a vertical direction of the incidence surface and to increase resolution of a scanning image in the vertical direction of the incidence surface. This may alleviate many technical difficulties.

In the aerial image measuring system according to the afore-described embodiment of the inventive concept, by using an anamorphic optical system, it may be possible to improve performance in a vertical direction of an incidence surface, compared with a conventional aerial image measuring system, and it may be possible to reconstruct an aerial image of an anamorphic optical system of a high NA EUV scanner.

Thus, it may be possible to previously check whether a defect in an EUV mask for a high NA is copied in a wafer scanner, through a high performance anamorphic aerial image measurement, and thereby to prevent a lot of wafer-level defects from being caused by a defect of a mask pattern. This may make it possible to increase a wafer yield.

While example embodiments of the inventive concept have been particularly shown and described, it will be understood by one of ordinary skill in the art that variations in form and detail may be made therein without departing from the spirit and scope of the attached claims.

What is claimed is:

1. A system of measuring an image of a pattern in a high numerical aperture (NA) scanning-type extreme ultra-violet (EUV) mask, comprising:
    a coherent EUV light source generating an EUV light through a high order generation process;
    an x-ray toroidal mirror focusing the EUV light on an incidence surface to have different focal lengths in a horizontal direction and a vertical direction of the incidence surface;
    an x-ray flat mirror allowing light, which is reflected by the x-ray toroidal mirror, to be incident into the mask;
    an x-ray beam splitter configured to reflect one portion of a beam focused by the x-ray toroidal mirror and to transmit another portion of the beam;
    a light detection part detecting the reflected one portion of the beam emitted from the x-ray beam splitter;
    an anamorphic zone-plate lens focusing the transmitted other portion of the beam emitted from the x-ray beam splitter on the mask, the anamorphic zone-plate lens having the same focal length and different numerical apertures (NA) in the horizontal and the vertical directions of an incidence surface;
    a stage, on which a reflection-type EUV mask is placed, and which moves in a direction of an x-axis or a y-axis to scan an image of the reflection-type EUV mask; and
    an anamorphic photo sensor, which is configured to measure an energy of the reflected portion of the EUV light when the EUV light is reflected by the EUV mask, comprises a detector array, and has different sizes from each other in the horizontal and the vertical directions of an incidence surface of the detector array.

2. The system of claim 1, wherein the x-ray flat mirror is configured such that light, which is reflected from the x-ray toroidal mirror and has an angle smaller than 4°, is incident into the EUV mask at an angle of 5 to 7°.

3. The system of claim 1, wherein the x-ray toroidal mirror is configured to focus an EUV beam on the anamorphic zone-plate lens in a shape of the zone-plate lens and to improve light focusing efficiency of the zone-plate lens.

4. The system of claim 1, wherein, when light, which is focused by the anamorphic zone-plate lens and is reflected by a surface of the mask, is diffused in an anamorphic shape, to detect the light diffused in the anamorphic shape, the anamorphic photo sensor is configured to have different device sizes in horizontal and vertical directions of an incidence surface, and the anamorphic photo sensor is provided to satisfy the following equations:

$D(x)=NA(x)*L$, and $D(y)=NA(y)*L$ where $D(x)$ and $D(y)$) are array device sizes in an x-axis direction and a y-axis direction, L is a distance to the mask, and $NA(x)$ and $NA(y)$ are numerical apertures of the anamorphic zone-plate lens in the x-axis and the y-axis directions.

5. The system of claim 1, wherein light reflected by the x-ray beam splitter is detected by the light detection part and is used as a reference light, a signal value of the reference light detected by the light detection part is used to remove a noise component, which is caused by a variation in intensity of light generated by the coherent EUV light source, from a signal measured by the anamorphic photo sensor, and for both of x coordinate and y coordinate of the stage changed by driving the stage, the signal value of the reference light is compared with the signal value of the measured light to remove a noise component.

* * * * *